United States Patent [19]
Shirai et al.

[11] 4,405,995
[45] Sep. 20, 1983

[54] SEMICONDUCTOR MEMORY DRIVE
[75] Inventors: Kazunari Shirai; Izumi Tanaka, both of Yokohama, Japan
[73] Assignee: Fujitsu Limited, Kanagawa, Japan
[21] Appl. No.: 295,617
[22] Filed: Aug. 24, 1981
[30] Foreign Application Priority Data
Aug. 29, 1980 [JP] Japan ................. 55-119213
[51] Int. Cl.$^3$ .............................. G11C 11/40
[52] U.S. Cl. .................. 365/174; 365/218; 357/23
[58] Field of Search ............ 365/174, 218; 357/23
[56] References Cited
U.S. PATENT DOCUMENTS
3,825,946  7/1974  Frohman-Bentchkowsky ..... 257/23
4,161,039  7/1979  Rössler ............................. 365/218

Primary Examiner—Terrell W. Fears
Attorney, Agent, or Firm—Staas & Halsey

[57] ABSTRACT

An improved semiconductor memory device is provided, which has: (i) a first gate electrode in an electrically floating state, at least a part of which confronts a channel region of a semiconductor device and which is separated by an insulating layer from the channel region; (ii) a second gate electrode (i.e., a control electrode), at least a part of which confronts the first gate electrode and is separated by an insulating layer from the first gate electrode; and (iii) a third gate electrode (i.e., an erasing electrode), at least a part of which confronts the first gate electrode and is separated by an insulating layer from the first gate electrode. The insulating layer, separating at least a part of the erasing electrode from the first gate electrode, has a thickness (usually 50 to 300 Å) sufficient to allow the passage of charges from the first gate electrode to the erasing electrode through a tunneling effect, thereby discharging the first gate electrode.

10 Claims, 10 Drawing Figures

SEMICONDUCTOR MEMORY DRIVE

BACKGROUND OF THE INVENTION (1) Field of the Invention

The present invention relates to an improvement in a semiconductor memory device called an "EPROM" (erasable programmable read only memory).

(2) Description of the Prior Art

In most conventional EPROM devices, information is electrically written or stored, and the written or stored information can be erased by irradiation with ultraviolet rays so that repeated use of the device is possible.

Recently, research has been performed on EPROM devices in which both the writing and erasing of information can be performed electrically. As these EPROM devices can be handled very easily, the structure, especially the structure of the package, can be simplified. For example, U.S. Pat. No. 3,825,946 discloses the EPROM device which can be charged or discharged electrically. In this device, a second gate and a third gate are adapted so as to cooperatively enable a discharge to take place from a floating gate due to avalanche injection through an insulating layer having a thickness of about 500 to 1,000 angstroms. To discharge the floating gate, a positive pulse of a high voltage (e.g., approximately 35 volts) is applied to the second gate, with the third gate and the substrate grounded. To charge the floating gate, a positive pulse of a similarly high voltage is applied to the second and third gates, with the substrate grounded. However, application of a high voltage at a time during which the floating gate is charged and discharged is liable to cause a breakdown. If the floating gate is charged by applying a low voltage, no breakdown is caused even when a high voltage is applied to discharge the floating gate. However, in this case, two electrodes for high and low voltages, respectively, must be provided. If both a charge and a discharge of the floating gate is conducted at a relatively low voltage, reliability of the writing and erasing would be reduced.

SUMMARY OF THE INVENTION

It is a primary object of the present invention to provide an EPROM device in which electric writing and erasing can be performed with high reliability and which can be easily fabricated by application of a conventional technique.

Other objects and advantages will be apparent from the following description.

In accordance with the present invention, there is provided an improved semiconductor memory device which comprises a first gate electrode in an electrically floating state, at least a part of which confronts a channel region of a semiconductor device and which is separated by an insulating layer from the channel region. Also includes is a second gate electrode comprising a control electrode, at least a part of which confronts the first gate electrode and is separated by an insulating layer from the first gate electrode. Furthermore, a third gate electrode is included comprising an erasing electrode, at least a part of which confronts the first gate electrode and is separated by an insulating layer from the first gate electrode. Said insulating layer, separating at least a part of the erasing electrode from the first gate electrode, has a thickness sufficient to allow the passage of charge from the first gate electrode to the erasing electrode through a tunneling effect, thereby discharging the first gate electrode.

BRIEF DESCRIPTION OF THE DRAWINGS

The present invention will now be described with reference to the accompanying drawings.

FIGS. 1A through 6A and 1B through 6B are diagrams illustrating manufacturing steps for one embodiment of the semiconductor memory device of the present invention. FIGS. 1A through 6A are top plan views showing a main part of the device and FIGS. 1B through 6B are cross-sectional views thereof.

DESCRIPTION OF THE PREFERRED EMBODIMENTS

The steps used for manufacturing a semiconductor memory device according to the present invention will be described with reference to the drawings.

FIGS. A1 AND 1B (1) Boron ions ($B^+$) are injected in a silicon (Si) semiconductor substrate 1 in a dose of, for example, about $1 \times 10^{13}$ ions per $cm^2$ according to an ion implantation method to form a $p^+$ type channel cut region 2.

(2) Arsenic ions ($As^+$) are injected in a dose of, for example, about $5 \times 10^{15}$ per $cm^2$ according to the ion implantation method to form an $n^+$ type region 3 for a line for a power power source $V_{ss}$ having a ground potential level.

(3) A silicon dioxide ($SiO_2$) field insulating layer 4 having a thickness of, for example, about 5,000 to about 10,000 Å is formed, for example, according to a selective thermal oxidation method using a silicon nitride ($Si_3N_4$) film mask. When the mask is removed, the surface of an active region of the substrate 1 is exposed.

Figure 1A:
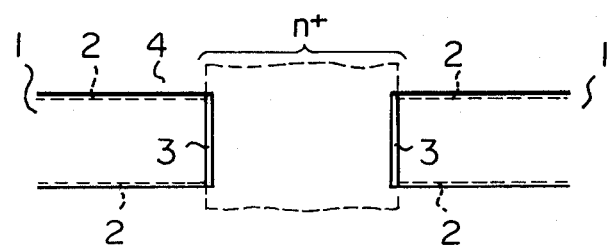
Figure 1B:
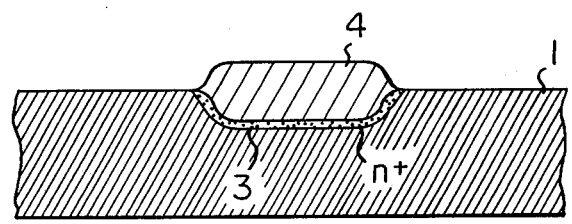
Figure 2A:
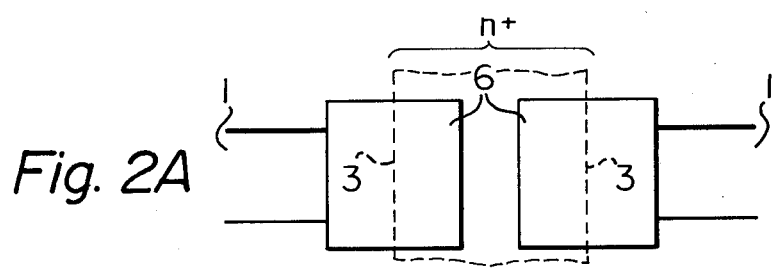
Figure 2B:
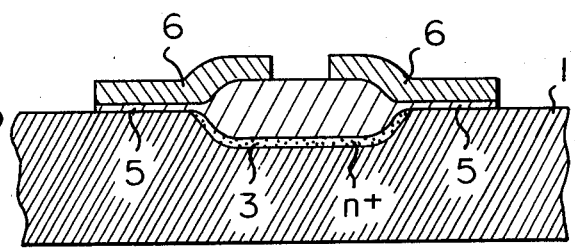

FIGS. 2A AND 2B (4) A first insulating layer 5 of silicon dioxide having a thickness of about 700 to about 1,000 A is formed on the exposed surface of the active region of the substrate 1, for example, according to the thermal oxidation method.

(5) A polycrystalline silicon layer 6, forming a first gate electrode having an electrically floating state, is formed in a thickness of about 4,000 to about 5,000 Å, for example, according to a chemical vapor phase deposition method. Instead of the polycrystalline silicon, a silicide of a refractory metal, such as molybdenum silicide or tungsten silicide, may be used.

(6) The polycrystalline silicon layer 6 and the silicon dioxide insulating layer 5 are patterned according to a photolithographic technique.

Figure 3A:
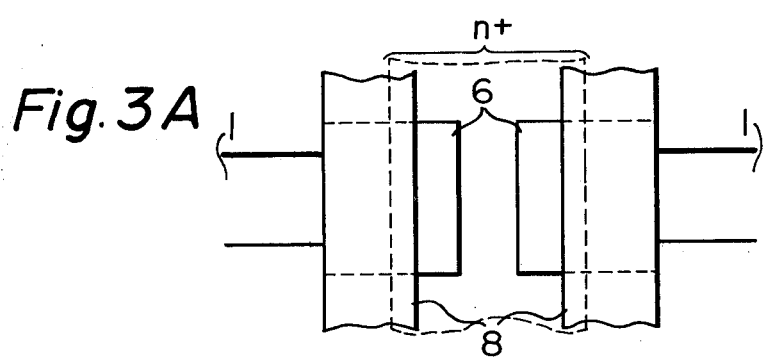
Figure 3B:
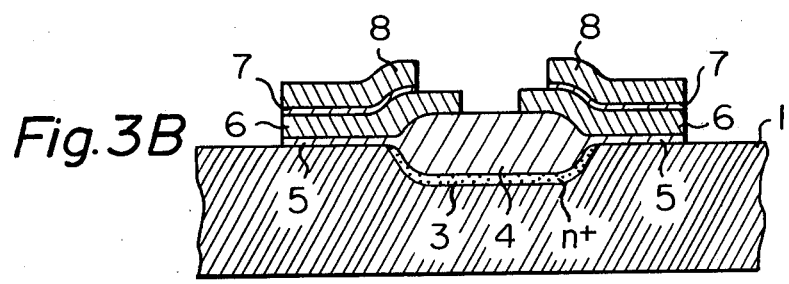
Figure 4A:
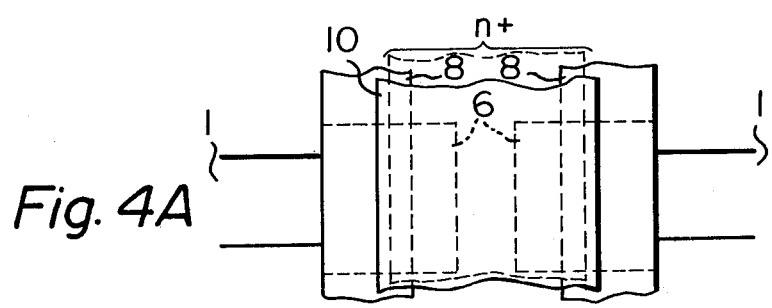
Figure 4B:
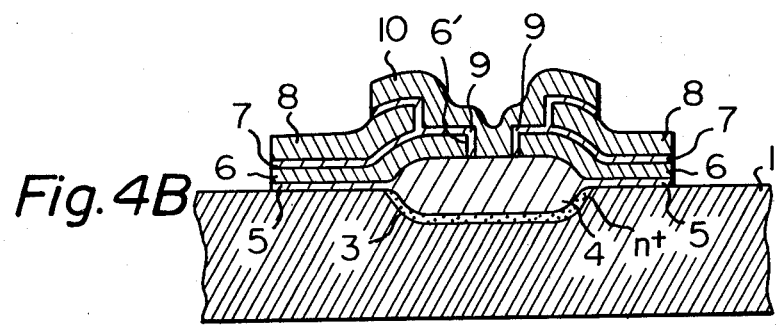
Figure 5A:
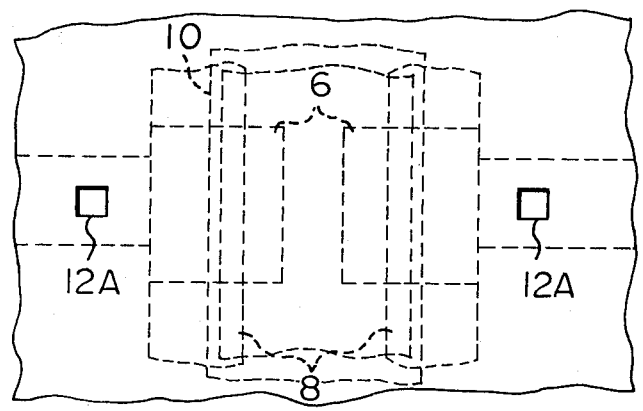
Figure 5B:
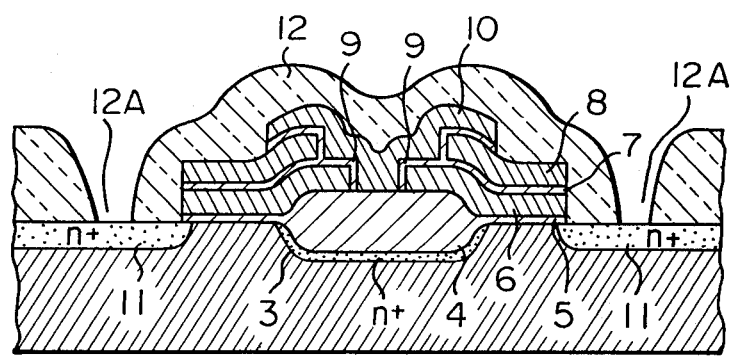

FIGS. 3A AND 3B (7) A second silicon dioxide insulating layer 7 having a thickness of about 800 to about 1,000 Å is formed on the exposed surface of the active region of the substrate 1 and on the polycrystalline silicon layer 6, for example, according to the thermal oxidation method.

(8) A polycrystalline silicon layer 8, forming a second gate electrode (i.e., the control electrode), is grown to a thickness of about 4,000 to about 5,000 Å according to the chemical vapor phase deposition method.

(9) The second polycrystalline silicon layer 8 and the second insulating layer 7 are patterned according to the photolithographic technique. Thus, the portion of the second silicon dioxide layer 7 formed on the polycrystalline silicon layer 6 in the above-mentioned step (7), which portion has not been covered with the polycrystalline silicon layer 8 in the above-mentioned step (8), is removed whereby a portion of the polycrystalline silicon layer 6 is exposed.

FIGS. 4A AND 4B

(10) A third insulating layer 9 of silicon dioxide is grown to a thickness of, for example, about 50 to about 300 Å, according to the thermal oxidation method on the exposed surface of the polycrystalline silicon layer 8, on the exposed surface of the polycrystalline silicon layer 6 and on the exposed surface of the substrate 1.

The third insulating layer 9 of silicon dioxide should have a thickness sufficient for the passage of electrons from the first polycrystalline silicon layer 6 (i.e., first gate electrode) to a third polycrystalline silicon layer 10 (i.e., an erasing or third electrode to be formed on the third insulating layer 9) through a tunneling effect. The tunnelling of the electrons discharging the first gate electrode 6, when the written information is erased in the resulting memory device. The thickness of the third insulating layer 9 should preferably be maintained at least at a part of a side wall 6′ of the first polycrystalline silicon layer 6. Such thickness for the intended passage of electrons by the tunnel effect is usually in the range of from 50 to 300 Å, more preferably from 100 to 200 Å.

(11) A polycrystalline silicon layer 10 for the third gate electrode (i.e., the erasing electrode) is grown to a thickness of about 4,000 Å according to the chemical vapor phase decomposition method.

(12) The polycrystalline silicon layer 10 and the third insulating layer 9 are patterned according to the photolithographic technique.

FIGS. 5A AND 5B

(13) Arsenic ions are injected according to the ion implantation method or other appropriate technique to form an n+ type line region 11.

(14) An insulating layer 12 of phosphosilicate glass or silicon dioxide is formed with a thickness of, for example, about 1 micron according to the chemical vapor phase deposition method.

(15) The insulating layer 12 is patterned according to the photolithographic technique to form electrode contact windows 12A.

FIGS. 6A AND 6B

(16) An aluminum (Al) film having a thickness of, for example, about 1 micron is formed according to a vacuum evaporation deposition method, and the aluminum film is patterned according to the photolithographic technique to form a bit line electrode lead 13.

Figure 6A:
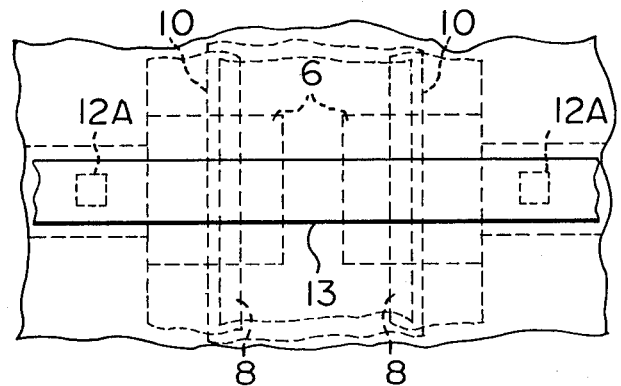
Figure 6B:
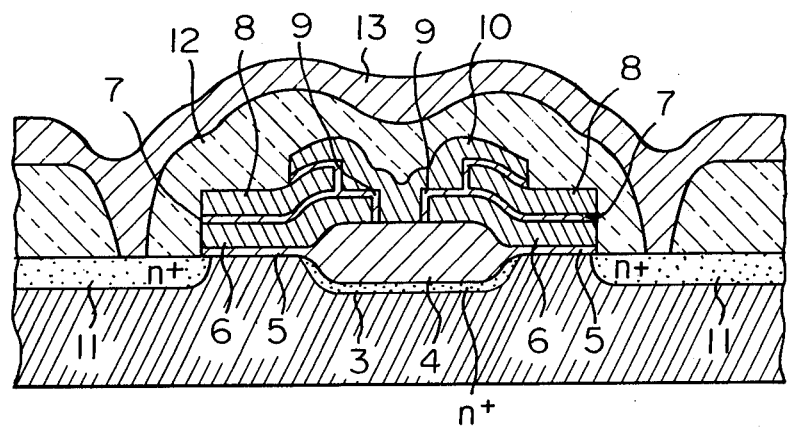

(17) Then, a cover film, electrode windows and the like are formed according to customary techniques. Thus, a semiconductor memory device is obtained as illustrated in FIGS. 6A and 6B. In this device one or more pairs of the first gate electrodes 6 and one or more pairs of the control electrodes 8 are disposed so that the two first gate electrodes 6 in each pair are symmetric to each other, relative to the erasing electrode 10; and the two control electrodes 8 in each pair are also symmetric to each other, relative to the erasing electrode 10.

The device which has been fabricated according to the above procedures is operated as follows.

Writing

The polycrystalline silicon layer 10 for the third gate electrode, which acts as a charge-releasing gate or an erasing electrode, and the n+ type region 3 acting, as a source region, are maintained at the same potential level (ground potential level). In this ground state, a positive high voltage is applied to the polycrystalline silicon layer 8 for the second gate electrode which acts as a control gate, whereby electrons are injected into the polycrystalline silicon layer 6 for the first floating gate electrode and the first floating gate electrode 6 is charged. The high voltage applied is usually in the range of from about 20 to about 30 volts, preferably from about 20 to about 25 volts.

Reading

The polycrystalline silicon layer 10 for the third gate electrode, which acts as a charge-releasing gate, is maintained at the ground potential level. A voltage of, for example, +5 V is applied to the polycrystalline silicon layer 8 forming the second gate electrode and a voltage of, for example, +1 V is applied to the aluminum lead 13, which acts as a bit line to read a difference of a threshold voltage (Vth) among respective memory cells.

Erasing

The high voltage is applied to both the polycrystalline silicon layer 8, forming the second gate electrode which acts as a control gate, and the polycrystalline silicon layer 10, forming the third gate electrode which acts as a charge-releasing gate. The positive high voltage can also be applied only to the polycrystalline silicon layer 10 forming the third gate electrode. The application of the high voltage allows the charge accumulated in the polycrystalline silicon layer 6 for the first gate electrode to be released. The voltage applied in this erasing stage may be approximately the same as that applied in the above-mentioned writing stage, that is, usually in the range of from about 20 to about 30 volts, preferably from about 20 to about 25 volts. This release of charge from the polycrystalline silicon layer 6 forming the first gate electrode and the passing of the charge to the polycrystalline silicon layer 10, forming the third gate electrode, is accomplished by utilizing the tunnel effect. The tunnel effect is generated, because the intervening insulating layer 9 is very thin, that is, 50 to 300 Å.

As will be apparent from the foregoing description, according to the present invention, there is provided an improved EPROM device comprising (i) a first gate electrode in an electrically floating state, at least a part of which confronts a channel region of a semiconductor substrate and which is separated by a thin insulating layer from the channel region; (ii) a second gate electrode (i.e., a control electrode), at least a part of which confronts the first gate electrode and is separated by a thin insulating layer from the first gate electrode; and (iii) a third gate electrode (i.e., an erasing electrode), at least a part of which confronts the first gate electrode (and, preferably, also the second gate electrode) and which is separated by a very thin insulating layer. In this EPROM device, charge accumulated in the first gate electrode (i.e., the floating gate) can be released very easily by applying a relatively low voltage (i.e., about 20 to about 30 volts) at least to the third erasing electrode. Accordingly, erasing of the device can be effected with a high reliability.

It will be understood that, although a preferred embodiment of the semiconductor memory device of the present invention is herein described specifically for an n-channel type device, the present invention can similarly be applied to a p-channel type device.

We claim:

1. An improved semiconductor memory device formed on a substrate having a channel region, comprising:
   an insulating layer formed on the channel region;
   a first gate electrode, formed on the insulating layer, in an electrically floating state, at least a part of which being positioned over the channel region of the semiconductor device and being separated by the insulating layer from the channel region;
   a second gate electrode, formed over the first gate electrode, comprising a control electrode, at least a part of which facing the first gate electrode and being separated by the insulating layer from the first gate electrode; and
   a third gate electrode, formed over the first gate electrode, the second gate electrode and the channel region, comprising an erasing electrode, at least a part of which facing the first gate electrode and being separated by the insulating layer from the first gate electrode;
   said insulating layer separating at least a part of the erasing electrode from the first gate electrode having a thickness sufficient to allow passage of charges from the first gate electrode to the erasing electrode through a tunneling effect, thereby discharging the first gate electrode.

2. A semiconductor memory device according to claim 1, wherein said first gate electrode has a side wall, and wherein at least a part of the side wall of the first gate electrode is separated from the erasing electrode by said insulating layer having a first thickness.

3. A semiconductor memory device according to claim 1 or 2, wherein said first thickness of said insulating layer, separating at least a part of the erasing electrode from the first gate electrode, is 50 to 300 angstroms.

4. A semiconductor memory device according to claim 1 or 2, wherein said first thickness of said insulating layer, separating at least a part of the erasing electrode from the first gate electrode, is 100 to 200 angstroms.

5. A semiconductor memory device according to claim 1 or 2, wherein said insulating layer, separating at least a part of the erasing electrode from the first gate electrode, being formed by oxidizing a surface of the first gate electrode.

6. A semiconductor memory device according to claim 1, wherein one or more pairs of first gate electrodes and one or more pairs of control electrodes are disposed so that the two first gate electrodes in each pair are symmetric to each other, relative to the erasing electrode, and the two control electrodes in each pair are symmetric to each other, relative to the erasing electrode.

7. A semiconductor memory device, comprising:
   a substrate;
   a channel cut region of a first conductivity formed in said substrate;
   a power line region of a second conductivity formed on said channel cut region;
   a first insulating layer formed on said power line region and said substrate;
   a floating gate electrode formed on said first insulating layer;
   a second insulating layer formed on a first portion of said floating gate electrode, so that a second portion of said floating gate electrode is exposed;
   a control electrode formed on said second insulating layer;
   a third insulating layer formed on said control electrode and the second portion of said floating gate electrode; and
   an erasing electrode formed on said third insulating layer and said first insulating layer and facing both said floating gate electrode said control electrode, and said third insulating layer between said erasing electrode and said floating gate electrode having a first thickness sufficient to cause an electron tunneling effect to occur.

8. A semiconductor memeory device according to claim 7, wherein said first thickness being greater than or equal to 50 angstroms and less than or equal to 300 angstroms.

9. A semiconductor memory device according to claim 7, wherein said first thickness being greater than or equal to 100 angstroms and less than or equal to 300 angstroms.

10. A semiconductor memory device according to claim 7, 8 or 9, further comprising:
    a bit line region of the second conductivity formed in said substrate;
    a fourth insulating layer formed on said erasing electrode; and
    a bit line formed on said fourth insulating layer and in contact with said bit line region.

* * * * *

UNITED STATES PATENT AND TRADEMARK OFFICE
CERTIFICATE OF CORRECTION

PATENT NO. : 4,405,995
DATED : September 20, 1983
INVENTOR(S) : Kazunari Shirai et al It is certified that error appears in the above-identified patent and that said Letters Patent is hereby corrected as shown below:

Column 1, line 20, "the" should be --an--;

line 45, "a primary" should be --an--;

line 58, "includes" should be --included--.

Column 2, line 29, before "line", insert --power--;

after "a", first occurrence, delete "power";

line 40, "A" should be --$\overset{\circ}{A}$--.

Column 3, line 21, "tunnelling" should be --tunneling--;

line 32, "decomposition" should be --deposition--.

Column 6, line 36, "memeory" should be --memory--.

Signed and Sealed this

Seventh Day of February 1984

[SEAL]

Attest:

GERALD J. MOSSINGHOFF

Attesting Officer  Commissioner of Patents and Trademarks